(12) United States Patent
Takata et al.

(10) Patent No.: US 6,493,278 B2
(45) Date of Patent: Dec. 10, 2002

(54) SEMICONDUCTOR DEVICE AND CONTROL DEVICE FOR USE THEREWITH

(75) Inventors: Hidekazu Takata, Nara (JP); Ken Sumitani, Tenri (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/882,602

(22) Filed: Jun. 15, 2001

(65) Prior Publication Data

US 2001/0055227 A1 Dec. 27, 2001

(30) Foreign Application Priority Data

Jun. 15, 2000 (JP) ........................................ 2000-180627

(51) Int. Cl.⁷ ................................................ G11C 7/00
(52) U.S. Cl. .............. 365/195; 365/185.04; 365/189.07
(58) Field of Search ........................... 365/185.04, 195, 365/189.07; 714/163, 164

(56) References Cited

U.S. PATENT DOCUMENTS

| 4,513,389 A | * | 4/1985 | Devchoudhury ............ 711/164 |
| 4,713,753 A | * | 12/1987 | Boebert et al. ............. 711/164 |
| 5,838,613 A | * | 11/1998 | Takizawa ................ 365/185.04 |
| 6,122,716 A | * | 9/2000 | Combs ........................ 711/163 |
| 6,125,054 A | * | 9/2000 | Yusa et al. ............. 365/185.04 |

FOREIGN PATENT DOCUMENTS

| JP | 59-152599 | 8/1984 |
| JP | 01-173244 | 7/1989 |
| JP | 03-204053 | 9/1991 |
| JP | 06-250939 | 9/1994 |

* cited by examiner

*Primary Examiner*—Hoai Ho
*Assistant Examiner*—Gene N. Auduong
(74) *Attorney, Agent, or Firm*—Morrison & Foerster LLP

(57) ABSTRACT

A semiconductor device includes: a memory having a memory space for recording data, the memory space including addresses; at least one first storage section for storing at least a portion of an address at which access to the memory space is requested and/or data which is requested to be written to the memory space; and an operation restriction circuit for at least partially restricting operations to be performed on the memory. The operation restriction circuit controls restriction on the operations to be performed on the memory based on at least a portion of the data and/or the address stored in the at least one first storage section.

16 Claims, 7 Drawing Sheets

SEMICONDUCTOR DEVICE AND CONTROL DEVICE FOR USE THEREWITH

CROSS-REFERENCE TO RELATED APPLICATIONS

This application claims priority to Japanese Patent Application Number 2000-180627 filed Jun. 15, 2000, the content of which is incorporated herein by reference in its entirety.

BACKGROUND OF THE INVENTION

1. Field of the Invention

The present invention relates to a semiconductor device having a memory space composed of rewritable semiconductor memory cells, and a control device for use therewith. In particular, the present invention relates to a semiconductor device having a security function for protecting from unauthorized access any content which is stored in the memory space, and a control device for use therewith.

2. Description of the Related Art

A semiconductor device such as a semiconductor memory device has a memory space composed of rewritable semiconductor memory cells which are represented by respective addresses. A semiconductor memory device may store information (such as copyright-protected subject matter or privacy information of individuals) which should not be subjected to unauthorized reading by a third party, or information which should not be subjected to unauthorized overwriting (as in the case of IC card applications). There have been proposed some semiconductor devices having a memory space, and control devices for use therewith, which have a security function for protecting the stored contents (data) from such unauthorized access.

Hereinafter, a conventional semiconductor device having a security function will be described with reference to FIGS. 5 to 7.

FIG. 5 is a schematic block diagram illustrating a minimum structure for realizing a security function. A semiconductor device 600 shown in FIG. 5 includes a memory accessing means 604, a memory 613 having a memory space (semiconductor memory cells) for storing data, and a security means 609 inserted therebetween. With the security means 609, it is possible to restrict some or all of the operations which are externally requested.

The memory accessing means 604 externally receives an address signal 601, a control signal 602, and a data signal 603, and outputs an address signal 605 which designates one or several of the storage units (semiconductor memory cells) in the memory space of the memory 613 to which access is to be made; a control signal 607 which designates the type and/or content of access to be performed to the memory 613; and a data signal 608 which is used for inputting or outputting of data in accordance with the designated content in the memory 613.

The security means 609 is capable of restricting some or all of the operations which are represented by a signal which is output from the memory accessing means 604 to the memory 613. For example, the security means 609 is capable of restricting the reading of any content which is stored in the memory 613, restricting the overwriting of any content which is stored in the memory 613, or both.

A given operation which is instructed by the memory accessing means 604 to be per formed on the memory 613 is represented by the address signal 605, the control signal 607, and the data signal 608 which are output to the security means 609. In the case where the content of the operation which is instructed by the memory accessing means 604 to be performed on the memory 613 is permitted, the security means 609 outputs an address signal 610, a control signal 611, and a data signal 612 to the memory 613 to perform an operation as instructed by the memory accessing means 604. On the other hand, in the case where the content of the operation which is instructed by the memory accessing means 604 to be performed on the memory 613 is not permitted, the security means 609 applies a conversion process to at least one of the address signal 610, the control signal 611, and the data signal 612. If the externally instructed operation involves outputting of the data which is stored in the memory 613, the security means 609 applies a conversion process to the data signal 608 which is output from the security means 609 to the memory accessing means 604. Thus, the operations to the memory 613 are restricted so that any operations which are not permitted will not occur, thereby realizing a security function for the memory 613.

All of the component elements of the semiconductor device 600 shown in FIG. 5 may be provided on one device. Alternatively, the component elements may be distributed over a number of devices so that a security function will be realized when the devices are used in combination. For example, in the case where the security function is to be realized on a single device, an interface circuit for interfacing with the exterior of the device may be utilized as the memory accessing means 604, while a circuit for restricting some or all of the operations which require access to the memory space may be inserted (as the security means 609) between the memory 613 as a circuit having a memory space and the memory accessing means 604.

Alternatively, in the case where the security function is to be realized on a number of devices collectively, e.g., when the memory accessing means 604, the security means 609, and the memory 613 are all provided on discrete devices, a circuit for restricting some or all of the operations which require access to the memory space may be inserted (as the security means 609) between a memory controller functioning as the memory accessing means 604 and the memory 613 having a memory space.

Hereinafter, a semiconductor device which is capable of outputting dummy data when a read access to the memory is made will be specifically described, by an illustration of a structure in which read operations to a memory are restricted until deactivation of a security function.

FIG. 6 is a schematic block diagram illustrating a conventional semiconductor device 450 which realizes the above-described security function. The semiconductor device 450 includes an interface circuit 404, a security circuit 409, and a memory 413 having a memory space composed of semiconductor memory cells. The security circuit 409 includes a password storage circuit 414 for storing a password, a comparison circuit 416, and an operation restriction circuit 418 for restricting operations to be performed on the memory 413.

In accordance with the semiconductor device 450, restriction on read operations is established (i.e., a security function is set) at the time when the semiconductor device 450 is turned ON. The security function can only be deactivated if a password (security control signal) 407 which is externally input via the interface circuit 404 matches a fixed password which is stored in the password storage circuit 414 in the security circuit 409, after which read operations can be performed normally.

In the case of making an external access to the stored content (data) which is stored in a given address in the memory 413 of the semiconductor device 450, an address signal 401, a control signal 402, and a data signal 403 are input to the interface circuit 404. The interface circuit 404 outputs an internal address signal 405 and an internal control signal 406, and if necessary an internal data signal 408, to the memory 413. In the case where the security function of the memory 413 is deactivated, the operation restriction circuit 418 outputs an address signal 410, a control signal 411, and a data signal 412 to the memory 413 in accordance with the address signal 401, the control signal 402, and the data signal 403, which are externally supplied (or more directly, in accordance with the internal address signal 405, the internal control signal 406, and the internal data signal 408). As a result, a normal operation is performed.

The semiconductor device 450 is constructed in such a manner that the security function of the memory 413 is set in an initial state which follows after the semiconductor device 450 is turned ON. As a result of the restriction on some or all of the operations to the memory 413 enforced by the security circuit 409, the semiconductor device 450 either refrains from operating at all or performs an operation which is different from an instructed operation. In applications which are arranged so as to output dummy data (instead of normal data) when a read access to the memory 413 is made, once the security function is set, only the dummy data will be output in response to any read access made to the memory 413, thereby preventing any unauthorized reading.

The following methods have been proposed as methods for realizing the aforementioned function of preventing unauthorized read. For example, a method described in Japanese Laid-Open Publication No. 59-152599 ensures that, while the security function is activated, the address signal 410 is not output from the security circuit 409 to the memory 413 unless certain conditions are satisfied. According to a method described in Japanese Laid-Open Publication No. 6-250939, the security circuit 409 encrypts the data signal 412 received by the memory 413 and outputs the encrypted version of the data signal 412 to the interface circuit 404 as the data signal 408. According to yet another method, it is ensured that, while the security function is activated, the security circuit 409 does not output the control signal 411 to the memory 413 for instructing a read operation to be commenced unless certain conditions are satisfied.

In order to deactivate the read restriction for the memory 413, a password (security control signal) 407 for deactivating the operation restriction is externally input. The externally input password 407 is compared by the comparison circuit 416 against a password signal 415 representing a pass word which is stored in the password storage circuit 414. If both passwords match, the comparison circuit 416 issues an operation restriction deactivating signal (password match signal) 417 to the operation restriction circuit 418. Upon receiving the operation restriction deactivating signal 417, the operation restriction circuit 418 permits any subsequent read operations to be performed to the memory. Thereafter, read operations will be normally performed upon request of a read.

Based on the above structure, the stored content in the memory cannot be properly read by a person who does not know the password and a method for inputting the password. Thus, unauthorized reading by a third party can be prevented if the password and the method for inputting the password are not made public.

FIG. 7 is a schematic block diagram illustrating a system 500 which realizes a security function for a semiconductor device by employing a different structure from that illustrated in FIG. 6. The system 500 includes control device 501 (e.g., CPU) which requests access to the memory, a semiconductor device 550 having a security function, and a security control device 506. In the system 500, the control device 501 outputs an address signal 502, a control signal 503, and a data signal 505 to the semiconductor device 550 to perform an operation on the semiconductor device 550. However, the control device 501 cannot take full control of the semiconductor device 550 unless the security function of the semiconductor device 550 is deactivated.

The security control device 506 is "challenged" to deactivate the security function of the semiconductor device 550 as follows. The security function of the semiconductor device 550 is deactivated only when the semiconductor device 550 recognizes from the content of a security communication signal 504 that the security control device 506 is a device which is predetermined to be granted access thereto. If the transmitter/recipient of the security communication signal 504 is not recognized as the predetermined device, the security function is not deactivated, and some or all of the operations to be performed on the semiconductor device 550 remain restricted.

During an initial state after the system 500 is turned ON, the security function of the system 500 is activated, so that the contents stored in the semiconductor device 550 cannot be properly read by an external device. The semiconductor device 550 "challenges" the security control device 506, i.e., transmits to the security control device 506 a signal (security communication signal) 504 for recognizing what device is being coupled to the semiconductor device 550, and the security control device 506 returns a signal which the security control device 506 generates based on the signal 504. The semiconductor device 550 determines whether or not the returned signal 504 matches an expected value. If the returned signal 504 matches the expected value, it is determined that the proper (or authorized) security control device 506 is coupled to the semiconductor device 550 as an external device, and accordingly deactivates the security function of the semiconductor device 550. The transmission/reception of the signal 504 may be repeated multiple times to gain enhanced security.

Unlike the security function of the semiconductor device 450 shown in FIG. 6, the system 500 provides a security function which may be enforced in such a manner that the "right" communication to occur between the semiconductor device 550 and the security control device 506 is directed to a different content each time such a communication is made. Therefore, the security function provided by the system 500 is difficult to break via simple signal analysis.

Thus, the semiconductor device 550 can provide a very secure security function because it permits a proper read operation to occur only when the security control device 506 coupled thereto is recognized as a predetermined device.

Instead of the above-described example where unauthorized reading is prevented, a security function can also be realized to restrict other types of operations as well. For example, in order to prevent unauthorized overwriting of the content stored in a memory, the same conditions as those described above for establishing or deactivating restriction on read operations can be applied for establishing or deactivating restriction on overwrite operations.

However, the above-described conventional method for realizing a security function has the following problems.

In the semiconductor device 450 shown in FIG. 6, since a fixed protocol is always used for deactivating the security function, a third party may relatively easily discover a security deactivating method by analyzing the input signals, e.g., the password (security control signal) 407.

On the other hand, the system 500 shown in FIG. 7, the content of the output (i.e., the security communication signal 504) from the security device 506 which is expected by the semiconductor device 550 can be varied, whereby a more secure security function can be realized. However, this structure has cost and/or size-related disadvantages associated with the security control device 506, which needs to be provided externally to the semiconductor device 550.

SUMMARY OF THE INVENTION

In one aspect of the present invention, there is provided a semiconductor device including: a memory having a memory space for recording data, the memory space including addresses; at least one first storage section for storing at least a portion of an address at which access to the memory space is requested and/or data which is requested to be written to the memory space; and an operation restriction circuit for at least partially restricting operations to be performed on the memory, wherein the operation restriction circuit controls restriction on the operations to be performed on the memory based on at least a portion of the data and/or the address stored in the at least one first storage section.

In accordance with the above structure, it is possible to control restriction on operations to be performed on the memory by utilizing at least a portion of data requested to be written to the memory space and/or an address at which the data is requested to be written. Some or all of the operations requiring any access to the memory space can be restricted until the operation restriction circuit deactivates restriction on operations to be performed on the memory, for example. Thus, it is difficult for a third party to decipher the method for deactivating the security function. Since it is not necessary to provide any special devices external to the semiconductor device for realizing the security function, there is no substantial penalty associated with the product size and/or cost.

In one embodiment of the invention, the access is a write operation.

In another embodiment of the invention, the at least one first storage section comprises a plurality of storage subsections.

In accordance with the above structure, (a portion of) a plurality of data requested to be written to the memory space and/or a plurality of addresses at which the data is requested to be written. Thus, it becomes even more difficult f or a third party to decipher the method for deactivating the security function, whereby a semiconductor device can be realized which cannot be easily subjected to unauthorized utilization.

In another embodiment of the invention, if at least one of the at least one first storage section does not contain the address or data stored therein, the operation restriction circuit maintains restriction on the operations to be performed on the memory.

In accordance with the above structure, security can be provided in a state (e.g., an initial state) where not all of the storage subsections contain (a portion of) data and/or an address.

In still another embodiment of the invention, the at least one first storage section includes an address storage section for storing the address, and a data storage section for storing the data; the semiconductor device includes a comparison circuit for performing a comparison of data in the memory space as designated by the address stored in the address storage section against the data stored in the data storage section; and the operation restriction circuit maintains restriction on the operations to be performed on the memory if a result of the comparison by the comparison circuit does not match.

In accordance with the above structure, a higher level of security can be realized because it is possible to confirm at the time of a read operation that the stored data has not been altered.

In still another embodiment of the invention, the semiconductor device further comprises: a second storage section for storing a reference address; and a comparison circuit for performing a comparison of the address stored in the first storage section against the reference address stored in the second storage section, wherein the operation restriction circuit deactivates restriction on the operations to be performed on the memory if a result of the comparison by the comparison circuit matches.

In accordance with the above structure, a higher level of security can be realized by comparing the addresses stored in the first storage section against the reference addresses stored in the second storage section.

In still another embodiment of the invention, the memory includes a storage unit for containing data which is to be concurrently rewritten; and the first storage section is included in the storage unit.

In accordance with the above structure, it becomes possible to vary security conditions by concurrently rewriting the contents stored in at least a portion of the memory space of the memory and the first storage section, whereby a higher level of security can be provided. Note that the second storage section should not be formed within the memory rewriting unit because if the second storage section were formed within the memory rewriting unit, the content stored in the second storage section would be lost when the rewriting unit is overwritten, thereby allowing a user an opportunity to freely set the content after the overwriting.

In another aspect of the present invention, there is provided a control device for controlling a memory having a memory space for recording data, the memory space including addresses, the control device comprising: at least one first storage section for storing at least a portion of an address at which access to the memory space is requested and/or data which is requested to be written to the memory space; and an operation restriction circuit for at least partially restricting operations to be performed on the memory, wherein the operation restriction circuit controls restriction on the operations to be performed on the memory based on at least a portion of the data and/or the address stored in the at least one first storage section.

In accordance with the above structure, it is possible to control restriction on operations to be performed on the memory by utilizing at least a portion of data requested to be written to the memory space and/or an address at which the data is requested to be written. Some or all of the operations requiring any access to the memory space can be restricted until the operation restriction circuit deactivates restriction on operations to be performed on the memory, for example. Thus, it is difficult for a third party to decipher the method for deactivating the security function. By embedding the security function in any device (e.g., a memory controller) on a given system other than the memory, the penalty associated with the product size and/or cost can be reduced.

In one embodiment of the invention, the access is a write operation.

In another embodiment of the invention, the at least one first storage section comprises a plurality of storage subsections.

In accordance with the above structure, it becomes even more difficult for a third party to decipher the method for deactivating the security function, whereby a control device can be realized which cannot be easily subjected to unauthorized utilization.

In another embodiment of the invention, if at least one of the at least one first storage section does not contain the address or data stored therein, the operation restriction circuit maintains restriction on the operations to be performed on the memory.

In accordance with the above structure, security can be provided in a state (e.g., an initial state) where not all of the storage subsections contain (a portion of) data and/or an address.

In still another embodiment of the invention, the at least one first storage section includes an address storage section for storing the address, and a data storage section for storing the data; the semiconductor device includes a comparison circuit for performing a comparison of data in the memory space as designated by the address stored in the address storage section against the data stored in the data storage section; and the operation restriction circuit maintains restriction on the operations to be performed on the memory if a result of the comparison by the comparison circuit does not match.

In accordance with the above structure, a higher level of security can be realized because it is possible to confirm at the time of a read operation that the stored data has not been altered.

In still another embodiment of the invention, the control device further comprises: a second storage section for storing a reference address; and a comparison circuit for performing a comparison of the address stored in the first storage section against the reference address stored in the second storage section, wherein the operation restriction circuit deactivates restriction on the operations to be performed on the memory if a result of the comparison by the comparison circuit matches.

In accordance with the above structure, a higher level of security can be realized by comparing the addresses stored in the first storage section against the reference addresses stored in the second storage section.

In still another embodiment of the invention, the memory includes a storage unit for containing data which is to be concurrently rewritten; and the first storage section is included in the storage unit.

In accordance with the above structure, it becomes possible to vary security conditions by concurrently rewriting the contents stored in at least a portion of the memory space of the memory and the first storage section, whereby a higher level of security can be provided. Note that the second storage section should not be formed within the memory rewriting unit because if the second storage section were formed within the memory rewriting unit, the content stored in the second storage section would be lost when the rewriting unit is overwritten, thereby allowing a user an opportunity to freely set the content after the overwriting.

Thus, the invention described herein makes possible the advantages of: (1) providing a semiconductor device having a security function for preventing unauthorized read or overwrite which can be deactivated by a method which is difficult for any unauthorized third party to analyze and decipher, such that the security function can be realized without the need to require a special external device; and (2) providing a control device for such a semiconductor device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples, with reference to the accompanying figures.

EXAMPLE 1

Figure 1:
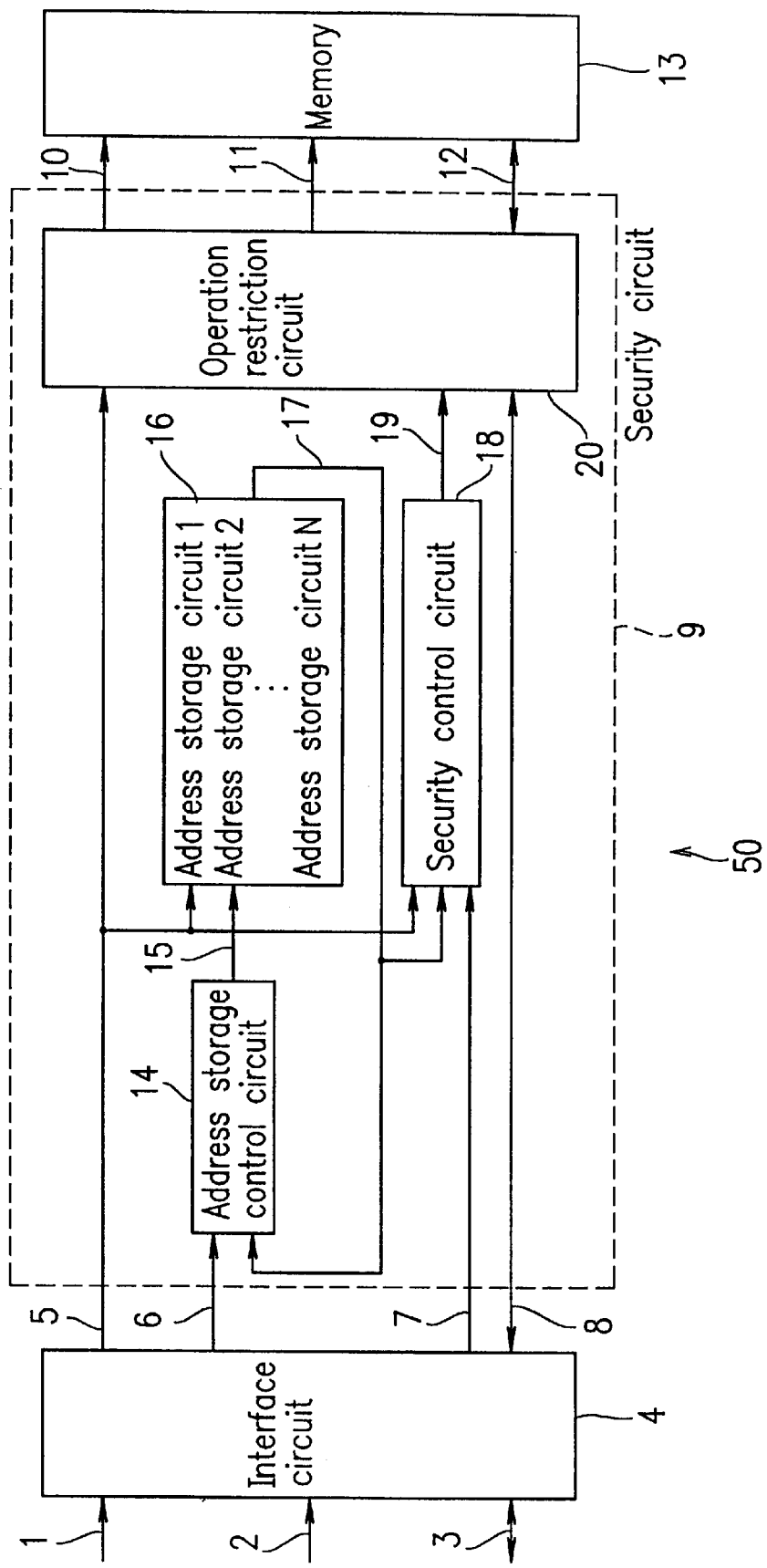
FIG. 1 is a schematic block diagram illustrating a semiconductor device incorporating a control device for a memory according to Example 1 of the present invention.

FIG. 1 is a schematic block diagram illustrating a semiconductor device 50 having a memory space composed of rewritable semiconductor memory cells according to Example 1 of the present invention. The semiconductor device 50 includes an interface circuit 4, a security circuit 9, and a memory 13 (defining a memory space) composed essentially of rewritable semiconductor memory cells. In general, a "memory space" includes a plurality of addresses, where data can be recorded corresponding to each address.

The security circuit 9 includes: an address storage control circuit 14; an address storage circuit section 16 capable of storing N addresses: a security control circuit 18; and an operation restriction circuit 20 for restricting the operations to be performed on the memory 13. The security circuit 9 functions as a control circuit for the memory 13. It is assumed that the address storage circuit section 16 includes N address storage circuits 1 to N (where N is a natural number), such that each of the address storage circuits 1 to N stores one address. Each of the address storage circuits 1 to N functions as a storage subsection.

The memory 13 may include volatile semiconductor memory cells (as in static RAMs) or non-volatile semiconductor memory cells (as in EEPROMs).

All of the component elements of the semiconductor device 50 may be provided on one device to realize a security function for the memory 13. However, it is not necessary to provide all of the aforementioned component elements on a single device. For example, the security function may be realized on a number of devices collectively, e.g., by employing a separate security device, which includes the interface circuit 4 and the security circuit 9, to control the memory 13.

Hereinafter, a security protocol of the semiconductor device 50 according to the present invention, i.e., a method for restricting operations which require access to the memory space composed of rewritable semiconductor memory cells, will be described. The following description will be directed to an instance of "unauthorized read prevention function" where, when a portion of data is to be read from a partial region of the memory 13, dummy data is output in the place of the actual data, thereby restricting the read operations to be performed to the data stored in the memory.

The semiconductor device 50 receives an address signal 1, a control signal 2, and a data signal 3, which are externally input for the purpose of reading data stored at a given address of the memory 13.

Upon analyzing the address signal 1, the control signal 2, and the data signal 3, the interface circuit 4 recognizes that a read operation has been externally issued for the semiconductor device 50. Accordingly, the interface circuit 4 outputs an internal address signal 5 and an internal control signal 6 to instruct that data stored at an address in the memory space which is designated by the internal address signal 5 be transmitted via an internal data signal 8. The interface circuit 4 includes a circuit for an analyzing externally-input signal s, and a state machine for controlling the operation of controlling the stored content in the semiconductor device 50, a circuit for controlling an output signal in accordance with external requests, and the like. The exact structure of the interface circuit 4 may vary depending on the specification of the semiconductor device 50.

The security circuit 9 outputs t he address signal 10 and the control signal 11 to the memory 13, and reads the content which is stored in the memory 13 via the data signal 12. In the initial state, the security control circuit 18 is reset, and an internal control signal 19 is issued to indicate to the operation restriction circuit 20 that the security function has not been deactivated. The operation restriction circuit 20 examines the received internal address signal 5, and upon determining that the address represented by the internal address signal is a predetermined address, exchanges the data which is read from the memory 13 (i.e., the data signal 12) with dummy data, and outputs an internal data signal 8 representing the dummy data to the interface circuit 4.

The interface circuit 4 receives the dummy data via the internal data signal 8, and outputs the dummy data to an external device via the data signal 3. Thus, it is made impossible to perform a proper read operation from that particular address. As a result, the unauthorized reading or utilization of the content stored in the semiconductor device 50 can be prevented.

Instead of exchanging the data represented by the data signal 12 with dummy data, the operation restriction circuit 20 can utilize various methods as a means for restricting the reading from the memory 13, without limitation. For example, an address represented by the address signal 5 may be exchanged with a dummy address which is output to the memory 13 as the address signal 10. Alternatively, the control signal 11, which is used to instruct reading from the memory 13, may be prevented from being output.

As the operation restriction circuit 20, any circuit structure that restricts an operation (which is not limited to a read operation) which requires access to the memory space may be employed. For example, when an overwriting of the data stored in the memory 13 is externally instructed, the address represented by the address signal 5 may be exchanged with a dummy address to be output as the address signal 10. Alternatively, the data represented by the data signal 8 may be exchanged with dummy data to be output to the memory 13 as the data signal 12. Thus, any externally-instructed operation which requires access to the memory space of the memory 13 can be prevented from occurring properly. As a result, the unauthorized use of the semiconductor device can be prevented.

Next, the security deactivation protocol of the semiconductor device 50 will be described.

An address signal 1, a control signal 2, and a data signal 3 are externally input to the semiconductor device 50. When an overwriting of the data at a given address of the memory 13 is requested (assuming that not all of the address storage circuits 1 to N in the address storage circuit section 16 contain addresses stored therein), the address storage control circuit 14 issues an address storage control signal 15, whereby an address for which an overwriting has been requested is stored in the address storage circuit section 16. In the address storage circuit section 16, addresses are sequentially stored in the address storage circuits 1 to N, beginning from the address storage circuit 1. The address storage control circuit 14 determines whether or not addresses are stored in all of the address storage circuits 1 to N based on an address signal 17 which is output from the address storage circuit section 16. If addresses are stored in all of the address storage circuits 1 to N, the address storage control circuit 14 does not issue the address storage control signal 15 so that no more addresses will be stored.

If at least one of the address storage circuits 1 to N in the address storage circuit section 16 does not contain an address stored therein, the security function cannot be deactivated. If all of the address storage circuits 1 to N contain addresses stored therein, security deactivation is performed by using the stored addresses. As the information stored in the address storage circuits, only some of the bits representing each address may be stored, rather than all of the bits representing each address, because the order of overwriting is significant, as opposed to the address value itself.

Alternatively, the address storage control circuit 14 may be a circuit which, based on the address signal 17, detects one or more of the address storage circuits 1 to N which do not contain any addresses stored therein, and outputs the address storage control signal 15 to instruct, when the internal control signal 6 is issued to request an address to be stored, that the address signal 5 be stored in the circuit(s) (1 to N) in which address(es) are not stored.

Each of the address storage circuits 1 to N in the address storage circuit section 16 may be a circuit which includes as many register circuits as the number of bits representing an address to be stored, and a register circuit for storing a bit indicating that an address is stored in the circuit. In this case, one of the address storage circuits 1 to N which has been instructed to store an address represented by the address signal 5 based on the address storage control signal 15 stores the address represented by the address signal 5 in the register circuits within the address storage circuit, and further sets a bit indicating that an address is stored in the address storage circuit.

As a method for deactivating the security function, for example, a method may be employed in which the security control circuit 18 uses an address stored in the address storage circuit section 16 as a password, requiring a security control signal 7 to be input. The security control signal 7 is generated in the interface circuit 4 based on an externally input signal.

Alternatively, as described in Japanese Application No. 2000-121844, a method may be employed in which the addresses of a memory are read in a certain sequence, and in which the security function is deactivated only when the values and order of the addresses match those stored in the address storage circuit section 16. Furthermore, as described in Japanese Laid-Open Publication No. 3-204053 or Japanese Laid-Open Publication No. 1-173244, a technique of utilizing for security control the information as to whether the order of addresses in a read operation is proper or not may be employed. Note that the present invention employs a different method from the method for storing addresses in the address storing regions according to Japanese Application No. 2000-121844, supra. According to Japanese Application No. 2000-121844, supra, it is necessary to externally designate storage of fixed data in the address storing regions, so that it is necessary to make public the means for storing security information. In contrast, according to the present invention, such a storage operation can itself be concealed within the usual operations of the semiconductor device. As a result, a security function can be realized without risking any public disclosure.

The aforementioned security deactivation is realized by the security control circuit 18. The security control circuit 18 outputs a security control signal 19 to instruct the deactivation of the security function to the operation restriction circuit 20. Once receiving the security control signal 19 which instructs the deactivation of the security function, the operation restriction circuit 20 no longer applies restriction on any read operations which are requested to be performed on the memory 13. As a result, read operations can take place properly.

As the security control circuit 18, a circuit which examines an order in which a number of addresses were accessed, e.g., as described in Japanese Application No. 2000-121844, supra, may be employed.

Although the present example illustrates a case in which unauthorized reading is prevented, the present invention is not limited thereto. It will be appreciated that the present invention is also applicable to restriction of any other types of access to the memory space, e.g., overwriting. For example, in the case where the present invention is used for restricting overwrite operations, a method can be employed in which the operation restriction circuit 20 outputs as an address signal 10 to the memory 13 a dummy address which is not identical to an address which has been requested to be overwritten (as represented by the address signal 5). Alternatively, a method may be employed in which a control signal 11 for instructing overwrite is prevented from being output to the memory 13 unless the security function is deactivated. Alternatively, a method may be employed in which data (i.e., dummy data ) which is not identical to the data which has been requested to be overwritten (as represented by the internal data signal 8) is output as a data signal 12 to the memory 13. Thus, it is possible to restrict overwrite operation in a manner similar to restricting read operations as discussed above.

EXAMPLE 2

Figure 2:
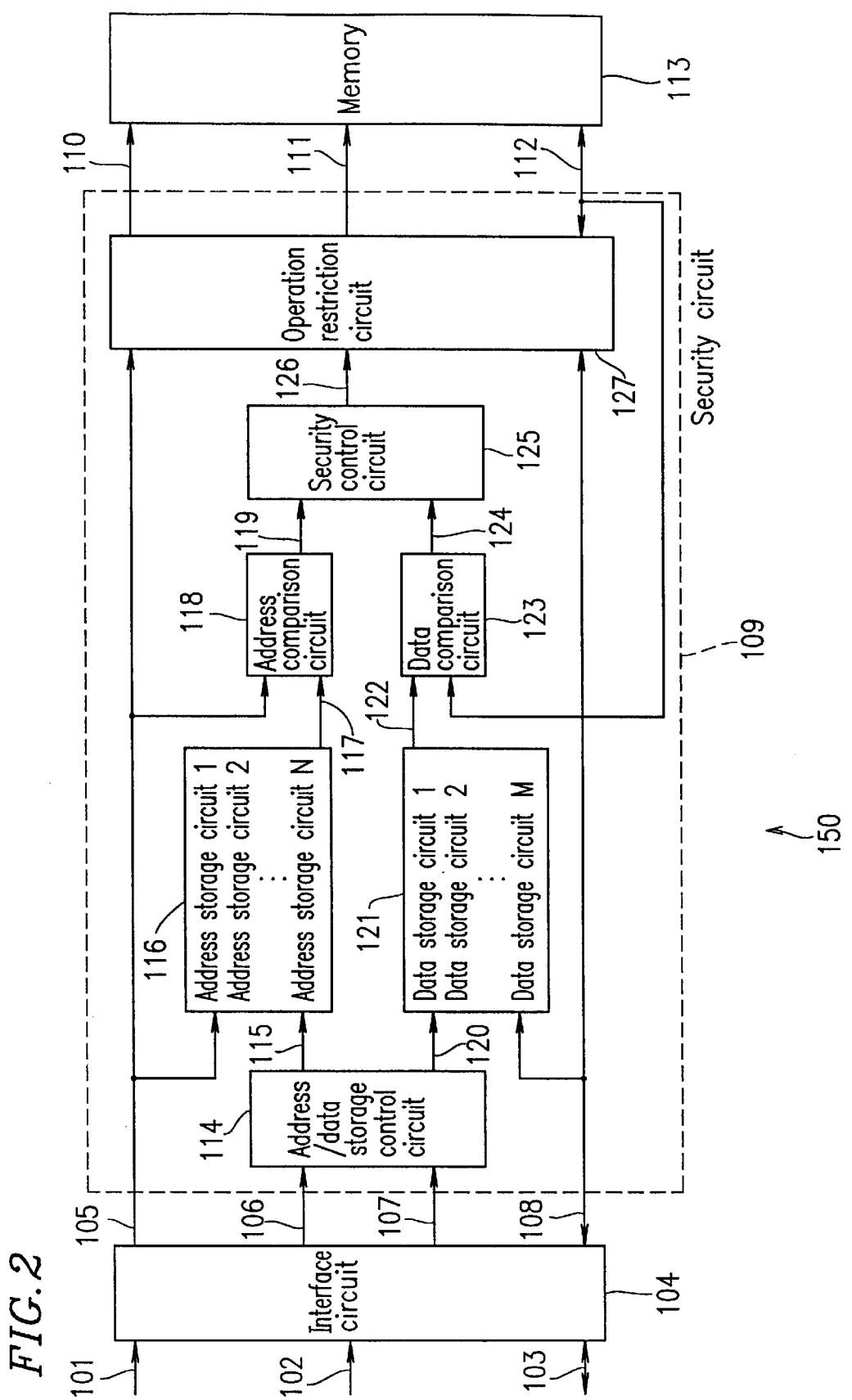
FIG. 2 is a schematic block diagram illustrating a semiconductor device incorporating a control device for a memory according to Example 2 of the present invention.

FIG. 2 is a schematic block diagram illustrating a semiconductor device 150 according to Example 2 of the present invention. The semiconductor device 150 includes an interface circuit 104, a security circuit 109, and a memory 113 (defining a memory space) composed essentially of rewritable semiconductor memory cells.

The security circuit 109 includes: address/data storage control circuit 114; an address storage circuit section 116 capable of storing N addresses (where N is a natural number); a data storage circuit section 121 capable of storing M units of data (where M is a natural number); an address comparison circuit 118; a data comparison circuit 123; a security control circuit 125; and an operation restriction circuit 127 for restricting the operations to be performed on the memory 113. The security circuit 109 functions as a control circuit for the memory 113.

In the present example, it is assumed that the address storage circuit section 116 includes N address storage circuits 1 to N, such that each of the address storage circuits 1 to. N stores one address. It is also assumed that the data storage circuit section 121 includes M data storage circuits 1 to N, such that each of data storage circuits 1 to M stores one unit data. Each of the address storage circuits 1 to N and each of data storage circuits 1 to M functions as a storage subsection.

All of the component elements of the semiconductor device 150 may be provided on one device to realize a security function for the memory 113. However, it is not imperative that the semiconductor device 150 is realized as a single device. For example, the security function may be realized on a number of devices collectively, e.g., by employing a separate security device, which includes the interface circuit 104 and the security circuit 109, to control the memory 113.

Although the following description is directed to a case where the number N of addresses which can be stored in the address storage circuit section 116 and the number M of data which can be stored in the data storage circuit section 121 are equal (N=M), it is not necessary that M and N be equal. In the present example, the memory 113, the interface circuit 104, and the operation restriction circuit 127 may be implemented by using similar means to the memory 13, the interface circuit 4, and the operation restriction circuit 20 according to Example 1.

Hereinafter, a security protocol of the semiconductor device 150 according to the present invention will be described. The following description will be directed to an instance of "unauthorized read prevention function" where an output resulting from a read operation to a partial region of the memory 113 is exchanged with dummy data, thereby restricting the read operations to be performed to the data stored in the memory.

The semiconductor device 150 receives an address signal 101, a control signal 102, and if necessary a data signal 103, which are externally input for the purpose of reading data stored in the memory 113. During an initial state which follows after the semiconductor device 150 is turned ON, the reading of at least a partial address region of the memory 113 is restricted. Unless the security function is deactivated, the operation restriction circuit 127 prevents a read operation from properly occurring, as may be realized by: outputting a signal which is obtained by subjecting a data signal 112 having been read from the memory 113 to a predetermined mathematical operation as an internal data signal 108 to the interface circuit 104; withholding a control signal 111 from being issued to the memory 113; or outputting an address which is obtained by converting an address represented by an internal address signal 105 as an address signal 110.

Next, the security deactivation protocol of the semiconductor device 150 will be described.

In the case where a request for overwriting the data stored in a given address is externally made to the semiconductor device 150 by using the address signal 101, the control signal 102, and the data signal 103, then the address/data storage control circuit 114 stores the address for which overwrite has been requested in any address storage circuit within the address storage circuit section 116 where addresses are not stored yet. In doing so, it is ensured that addresses are sequentially stored in the address storage circuits 1 to N, beginning from the address storage circuit 1. At the same time, any data which is sought to be written in the memory 113 is sequentially stored in the data storage circuits 1 to M (assuming N=M), beginning from the data storage circuit 1. The address/data storage control circuit 114 no longer stores such addresses or data if all of the address storage circuits 1 to N or if all of the data storage circuits 1 to M (assuming N=M) already contain addresses and data stored therein.

According to the present example, storage of addresses is controlled based on an internal control signal (address storage control signal) 106 which is output from the interface circuit 104, and storage of data is controlled based on an internal control signal (data storage control signal) 107 which is output from the interface circuit 104. If all of the address storage circuits 1 to N already contain addresses stored therein, or if all of the data storage circuits 1 to M contain data stored therein, the address/data storage control circuit 114 prevents further storage of addresses or data by not generating the address storage control signal 115 or the data storage control signal 120, respectively. When all of the address storage circuits 1 to N and all of the data storage circuits 1 to M contain addresses and data stored therein, the security function can be deactivated on the basis of the stored addresses and data. As the addresses or data to be stored in the address or data storage circuits, only portions of each address or data may be stored, rather than the entire address or data, because the order of overwriting is significant, as opposed to the address or data value itself. In the present example, the address/data storage control circuit 114 may be implemented by using similar means to the address storage control circuit 14 according to Example 1 of the present invention. The address storage circuit section 116 and the data storage circuit section 121 may be implemented by using similar means to the address storage circuit section 16 according to Example 1 of the present invention.

As a method for deactivating the security function, various methods can be employed. For example, as described in Japanese Application No. 2000-121844, supra, a method may be employed in which read operations are performed to the addresses of the memory 113 in a certain sequence, and in which the security function is deactivated only when the values and order of the addresses match those stored in the address storage circuit section 116. Alternatively, the following method may be employed. When read operations are performed, the address comparison circuit 118 compares an address (address signal 105) for which a read operation has been requested against an address (address signal 117) stored in the address storage circuit section 116, and outputs the result of the comparison as a matching detection signal 119 to the security control circuit 125. Moreover, the data comparison circuit 123 compares data which has been read via the data signal 112 against data which is stored in the data storage circuit section 121 (data signal 122), and outputs the result of the comparison as a matching detection signal 124 to the security control circuit 125. If it is detected by the security control circuit 125 that the addresses match but that the data do not match, it is determined that the stored content has been subjected to an unauthorized overwriting, and the security control circuit 125 outputs a security control signal 126 to control the operation restriction circuit 127, thereby ensuring that the security function will not be deactivated. On the other hand, if it is detected by the security control circuit 125 that both the addresses and the data match, a signal instructing deactivation of the security function is output as a security control signal 126 to the operation restriction circuit 127. Once receiving the security control signal 126 which instructs the deactivation n of the security function, the operation restriction circuit 127 no longer applies restriction on any read operations which are requested to be performed on the memory 113. As a result, read operations can take place properly.

As the security control circuit 125, a circuit which examines an order in which a number of addresses were accessed, e.g., a s described i n Japanese Application No. 2000-121844, supra, plus additional determination circuitry f or determining not only matching of the address but also matching of the corresponding data, may be employed.

Although the present example illustrates a case in which unauthorized reading is prevented, the present invention is not limited thereto. As in Example 1, it will be appreciated that the present invention is also applicable to restricting any other types of access to the memory space, e.g., overwriting. For example, in the case where the present invention is used for restricting overwrite operations, a method can be employed in which the operation restriction circuit 127 cancels a requested overwrite operation, or performs an overwrite operation which is not identical to the requested overwrite operation. Thus, it is possible to restrict overwrite operations in a manner similar to restricting read operations as discussed above.

Although the above description illustrates a case where both the address stored in the address storage circuit section 116 and the data stored in the data storage circuit section 121 are utilized for realizing a security function, the effects of the present invention can also be obtained by utilizing only either one of the address stored in the address storage circuit section 116 or the data stored in the data storage circuit section 121, in a manner similar to using the address storage circuit section 16 according to Example 1.

EXAMPLE 3

Figure 3:
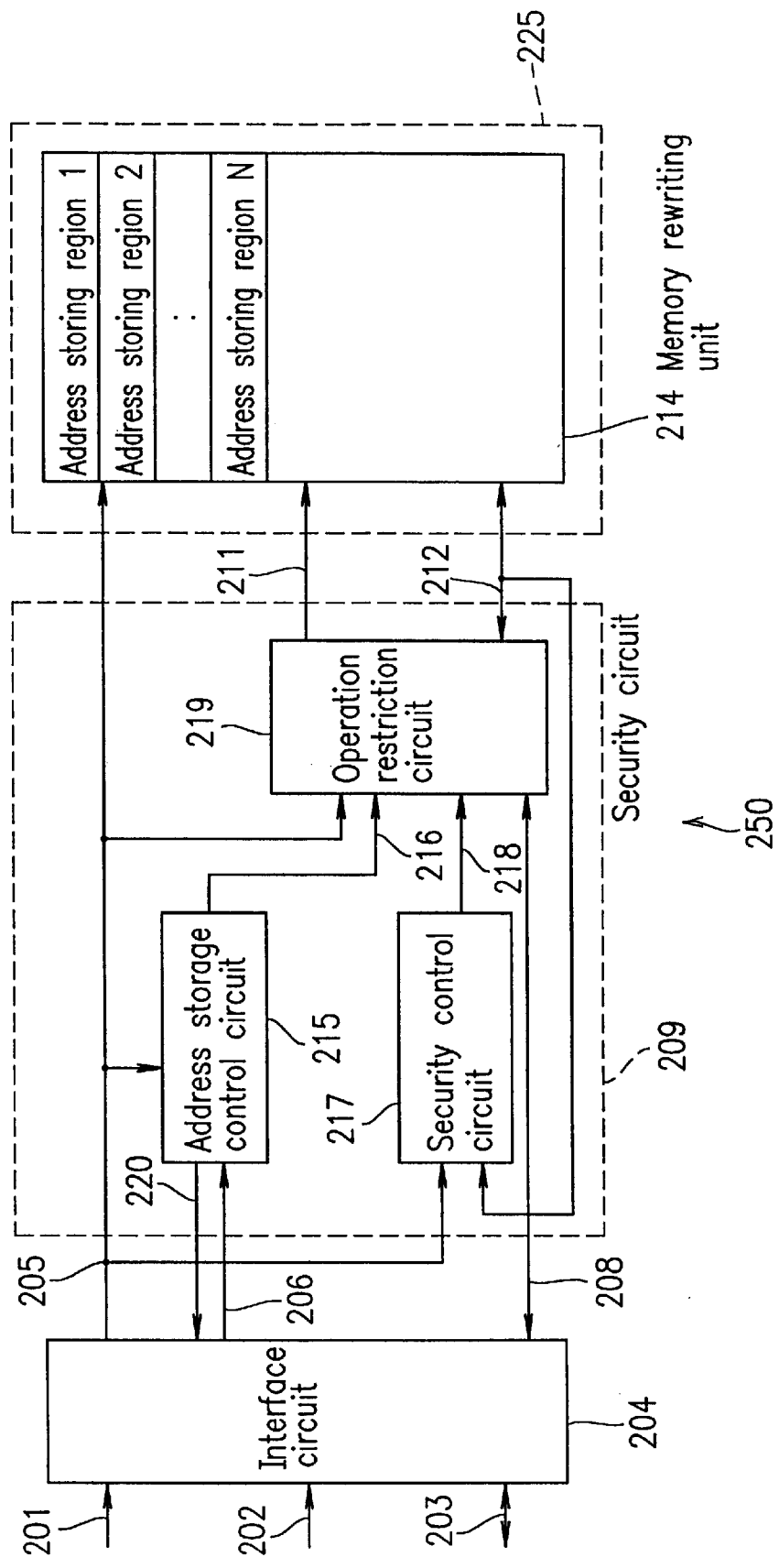
FIG. 3 is a schematic block diagram illustrating a semiconductor device incorporating a control device for a memory according to Example 3 of the present invention.

FIG. 3 is a schematic block diagram illustrating a semiconductor device 250 according to Example 3 of the present invention. The semiconductor device 250 is configured in such a manner that the function of the address storage circuit section 16 in the semiconductor device 50 of Example 1 is embodied within a rewritable memory 225.

The semiconductor device 250 includes an interface circuit 204, a security circuit 209, and a memory 225 which includes at least one memory rewriting unit 214 having a memory space composed essentially of concurrently-rewritable semiconductor memory cells. The security circuit 209 includes an address storage control circuit 215, a security control circuit 217, and an operation restriction circuit 219 for restricting the operations to be performed on the memory 225. The security circuit 209 functions as a control circuit for the memory 225.

The memory rewriting unit 214 includes address storing regions 1 to N which, as a whole, are capable of storing N addresses. Note that the address storing regions 1 to N included in the memory rewriting unit 214 correspond to the address storage circuits 1 to N in the address storage circuit section 16 of the semiconductor device 50 of Example 1.

The address storing regions 1 to N are preferably implemented by using address regions other than the address regions which are subject to regular requests for overwriting because the addresses stored in the address storing regions 1 to N, which are intended to be utilized as security information, may be destroyed through regular overwriting. For example, in the case where the present example is applied to a flash memory which is capable of block erasure, it would be preferable to provide extra row and/or column lines, in addition to those associated with addresses which are subjected to regular use, within each block to be concurrently erased; in this case, the memory cells which are coupled to the additional row lines and column lines can be used as the address storing regions 1 to N.

All of the component elements of the semiconductor device 250 may be provided on one device to realize a security function for the memory 225. However, it is not necessary to provide all of the aforementioned component elements on a single device. For example, the security function may be realized on a number of devices collectively, e.g., by employing a separate security device, which includes the interface circuit 204 and the security circuit 209, to control the memory 225 (including the memory rewriting unit 214).

As a security protocol for the semiconductor device 250, a method (e.g., the method described in Example 1) may be employed in which the operation restriction circuit 219 somehow modifies a data signal 212 representing the data read from the memory 225 before being output as an internal data signal 208.

As the method for concurrent rewriting, rewriting via a buffer, block erasure of a flash EEPROM, or other similar means may be used. Although the following description illustrates the case where the present invention is applied to a flash EEPROM which is capable of concurrent block erasure, the same technique can also be used for rewriting via a buffer. The following description is directed to the case where the data stored in the memory rewriting unit 214 cannot be erased unless restriction on erase operations is deactivated, thereby preventing unauthorized data overwriting.

An address signal 201, a control signal 202, and a data signal 203 are externally input to the semiconductor device 250 to request overwriting of data stored at a given address of the memory 225. Upon recognizing the request, the interface circuit 204 outputs an internal control signal 206 to the address storage control circuit 215. Determining that the address is within the memory rewriting unit 214, the address storage control circuit 215 outputs a signal 220 to the interface circuit 204. The interface circuit 204 reads the stored content in the address storing regions 1 to N, and stores the address for which overwrite has been requested in any address storing regions 1 to N where addresses are not stored yet. In addition to this operation, the data overwrite as externally requested is performed to the semiconductor device 250. In doing so, it is ensured that addresses are sequentially stored in the address storing regions 1 to N, beginning from the address storing region 1. The address storing regions 1 to N function as storage subsections.

If all of the address storing regions 1 to N already store addresses for which overwrite has been requested, the address storage control circuit 215 does not store any more addresses, and only performs regular data overwriting.

Upon determining that at least one of the address storing regions 1 to N does not contain an address stored therein, the address storage control circuit 215 outputs an address storage control signal 216 to the operation restriction circuit 219 so that the operation restriction circuit 219 prohibits erase operations from being performed on the memory rewriting unit 214. On the other hand, if all of the address storing regions 1 to N contain addresses stored therein, erase operations to the memory rewriting unit 214 are permitted on the basis of the stored addresses. As a method for prohibiting erase operations, for example, the operation restriction circuit 219 may withhold a control signal 211 from being issued to the memory 225. As the addresses to be stored in the address storing regions 1 to N, only portions of each address maybe stored, rather than the entire address, because the order of overwriting is significant, as opposed to the address value itself.

As a method for deactivating the security function, for example, a method described in Japanese Application No. 2000-121844, supra, may be employed, in which read operations are performed to the addresses of the memory rewriting unit 214 in a certain sequence, and in which the security function is deactivated only when the values and order of the addresses match those stored in the address storing regions 1 to N in the memory rewriting unit 214.

The security deactivation as described above is performed by the security control circuit 217, which outputs a security control signal 218 for instructing deactivation of the security function to the operation restriction circuit 219. Once receiving the security control signal 218 which instructs the deactivation of the security function, the operation restriction circuit 219 no longer applies restriction on any erase operations which are requested to be performed. As a result, erase operations can take place properly.

As the security control circuit 217, a circuit which examines an order in which a number of addresses were accessed, e.g., as described in Japanese Application No. 2000-121844, supra, plus additional latch circuitry for latching the content which is stored in the address storing regions 1 to N and which is read via the data signal 212, may be employed. The latched address(es) may be used as reference addresses.

In the present example, all of the contents stored in the address storing regions 1 to N are erased when the data stored in the memory rewriting unit 214 is erased. However, the data stored in the memory rewriting unit 214 is not erased unless all of the address storing regions 1 to N contain addresses stored therein. Thus, there is provided an advantage in that redundant erase operations can be automatically prevented since the contents stored in the memory rewriting unit 214 and the contents stored in the address storing regions 1 to N within the memory rewriting unit 214 are simultaneously erased, thereby eliminating the need to perform any further erasure.

Thus, the present example solves a problem which is associated with a structure in which address storing regions are provided in a memory rewriting unit other than the memory rewriting unit 214 because, in such a structure, it would be necessary to perform two erase operations, i.e., one for erasing the data stored in the memory rewriting unit 214 and another for erasing the contents stored in the address storing regions; otherwise, a special technique for effecting simultaneous erase operations would be required.

Furthermore, in the present example, it is possible to additionally employ the data storage section (data storing regions) illustrated in Example 2 of the present invention. In that case, it may be ensured that each erase operation performed also results in the erasure of any corresponding data stored in the data storing region. This can be realized, without entailing any increase in the number of erase operations to be performed, by providing the data storing regions within the same memory rewriting unit.

According to the present example, the same type of semiconductor memory cells as those already employed in the semiconductor device can be utilized as an address storage section. Therefore, it is not necessary to additionally employ any circuitry or manufacture processes which would be required for other types of memory cells.

For example, in embodiments where erase operations for volatile semiconductor memory cells are to be restricted, any data stored in the semiconductor memory cells will be lost as the supply of power is terminated. In this case, it is preferable that the address storage section is also volatile because using non-volatile memory cells for the address storage section, which is designed for the purpose of restricting erase operations, would bring about nothing but the extra complexity of having to perform an overwrite operation after the device is turned ON in order to clear the content which is already stored in the address storage section.

On the other hand, in the case where the semiconductor device incorporates non-volatile semiconductor memory cells, any data stored therein will not be lost after power termination. In this case, it is preferable to employ non-volatile means for the address storage section in order to continuously apply restriction on erase operations to protect the stored data after the device is turned ON again.

According to the present example, regardless of whether the semiconductor device incorporates volatile or non-volatile semiconductor memory cells, a satisfactory address storage section which has the same characteristics as those of the data storage means.(i.e. a memory device) can be provided.

In the case where the present example is embodied with a flash EEPROM, in which any erasure will occur on a block-by-block basis, it is possible to prevent unauthorized overwriting to some degree by simply prohibiting erase operations. In the case where the address storage section is implemented as flash EEPROM cells within a block for which erasure is prohibited, the addresses which were stored in the address storage section will be erased during an erase operation after the security function is deactivated. Therefore, it is possible to arrange the device so that a predetermined overwriting procedure will be started anew after erasure, without having to separately clear the address storing regions.

By providing an address storage section for erasure restriction purposes for each block, there is provided an additional advantage in that each address to be stored in the address storage section only needs to be representative of a location within each block, so that a smaller number of bits need to be stored, if at all. This enhances the scale economy associated with the address storing regions and/or the comparison circuits.

EXAMPLE 4

Figure 4:
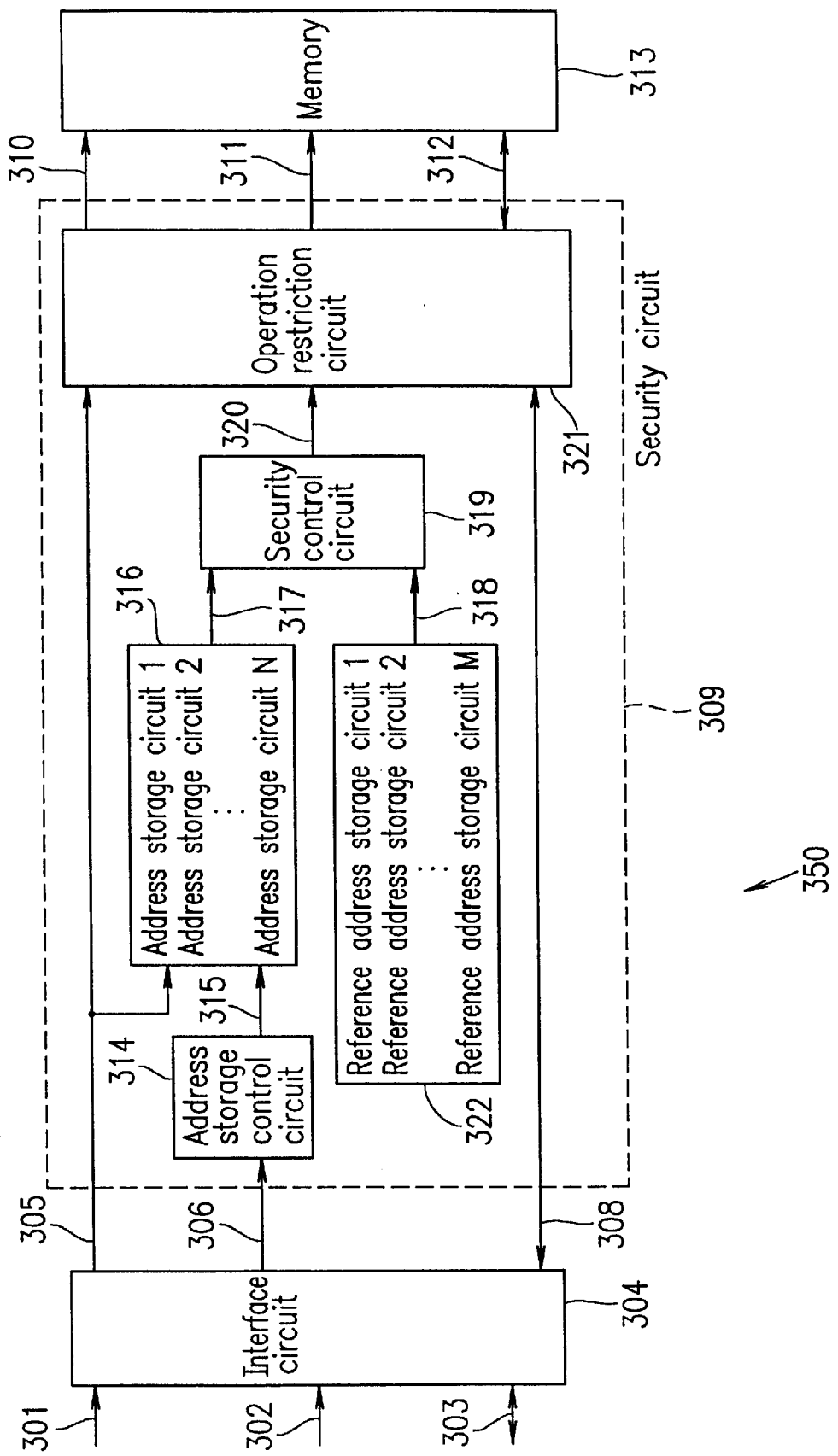
FIG. 4 is a schematic block diagram illustrating a semiconductor device incorporating a control device for a memory according to Example 4 of the present invention.
Figure 5:
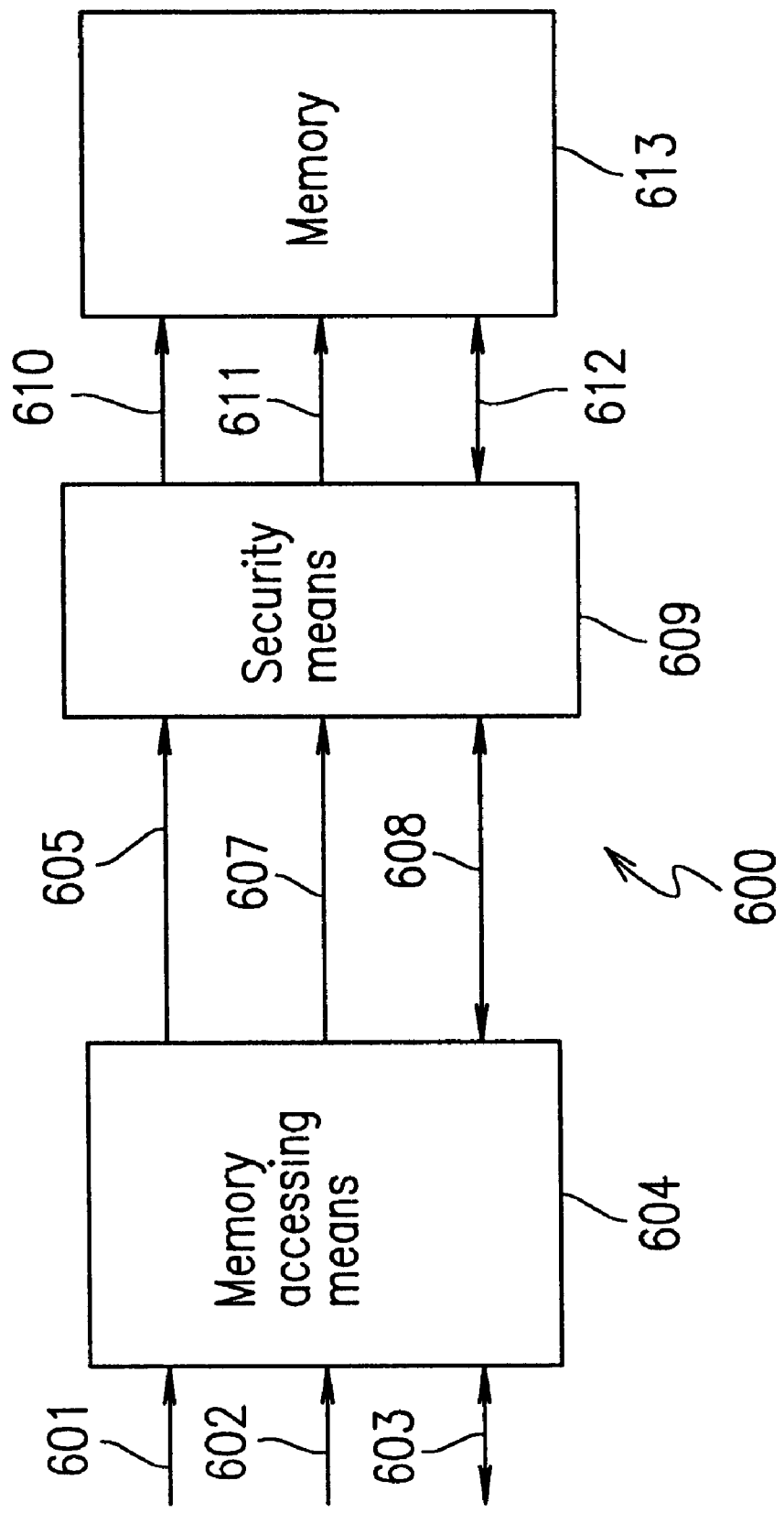
FIG. 5 is a schematic block diagram illustrating a security function in a semiconductor device.
Figure 6:
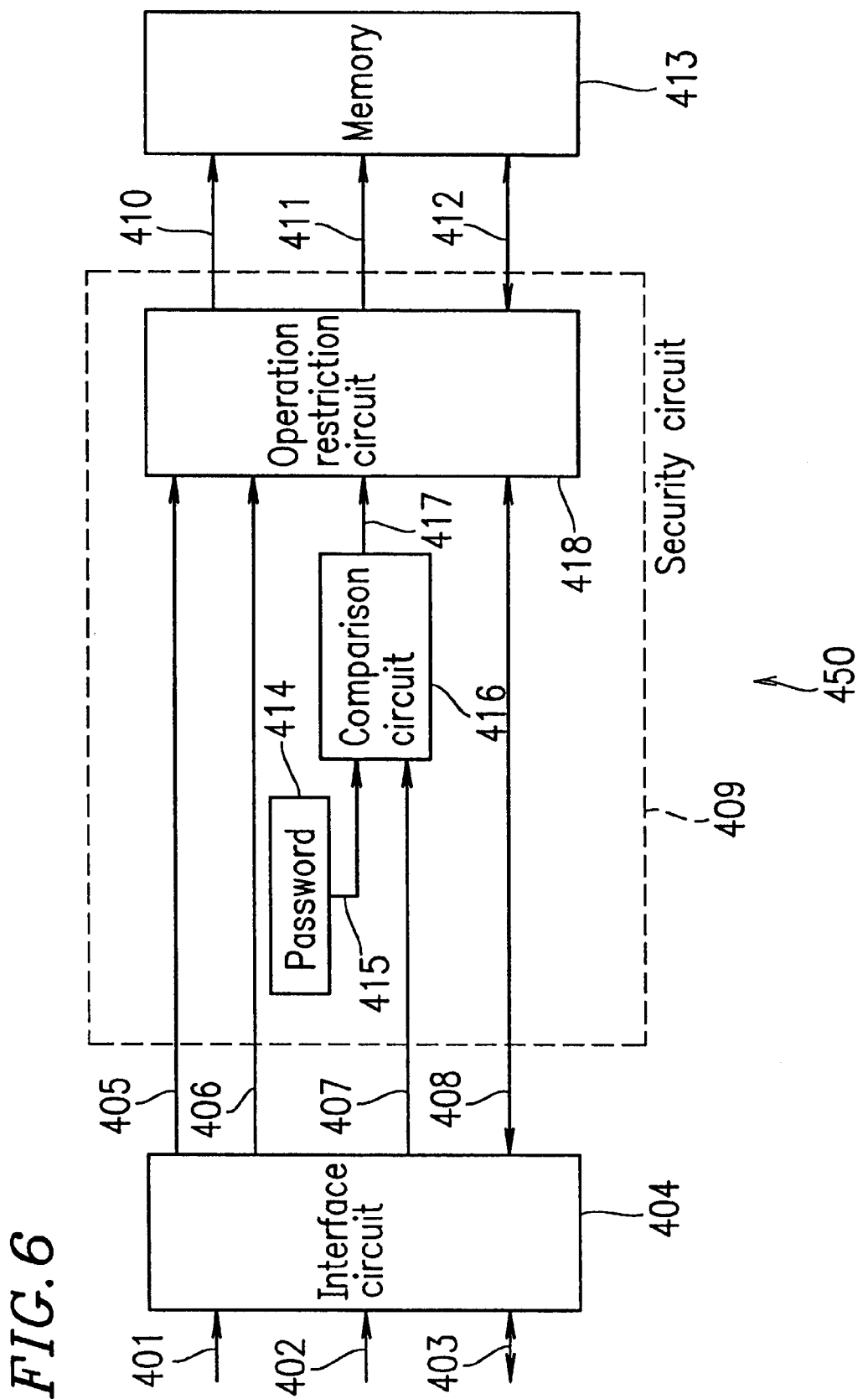
FIG. 6 is a schematic block diagram illustrating a conventional semiconductor device.
Figure 7:
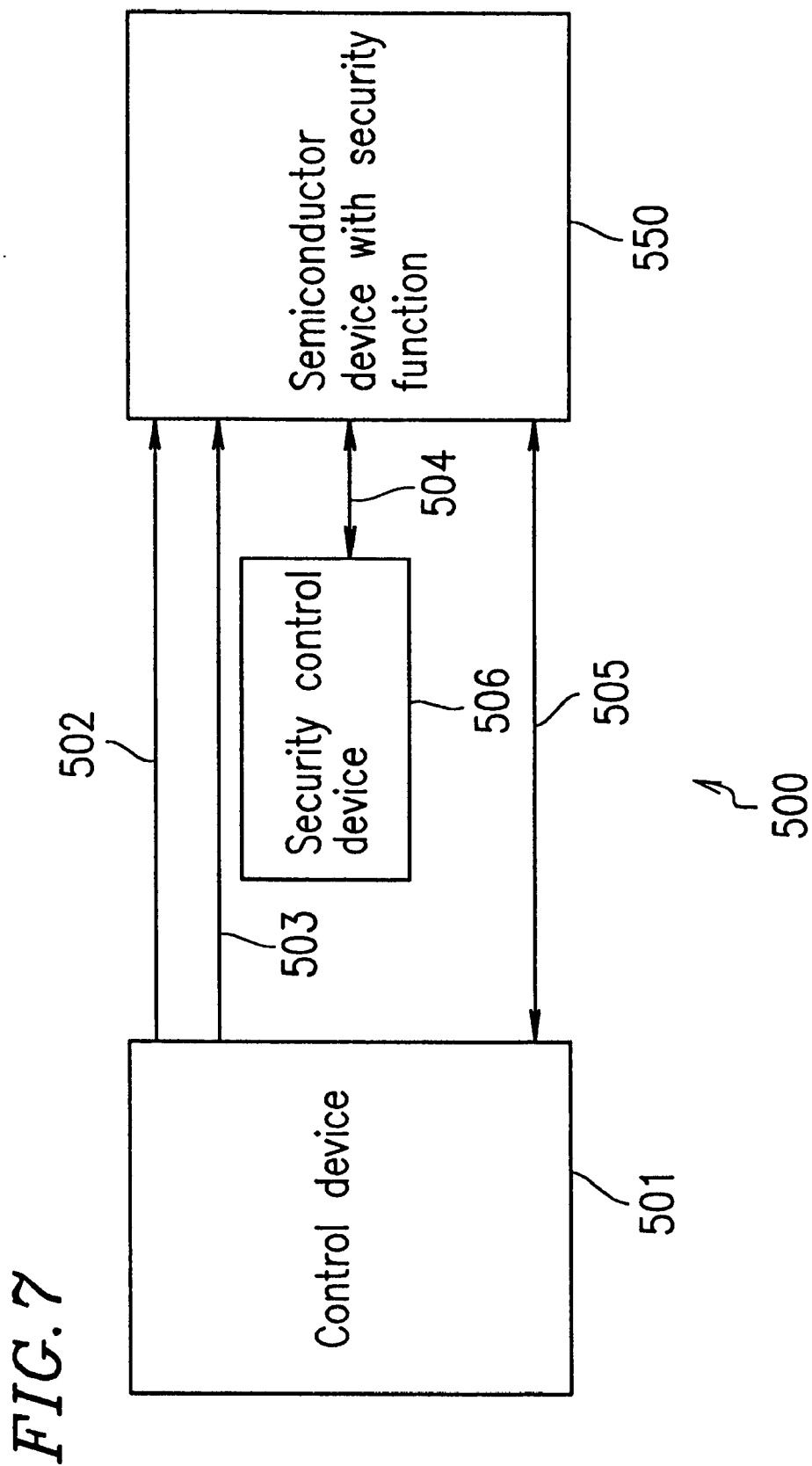
FIG. 7 is a schematic block diagram illustrating a conventional semiconductor memory device.

FIG. 4 is a schematic block diagram illustrating a semiconductor device 350 according to Example 4 of the present invention. The semiconductor device 350 includes an interface circuit 304, a security circuit 309, and a memory 313 having a memory space composed essentially of rewritable semiconductor memory cells. The security circuit 309 includes: an address storage control circuit 314; an address storage circuit section 316 capable of storing N addresses (where N is a natural number); a reference address storage circuit section 322 capable of storing M predetermined addresses data (where M is a natural number); a security control circuit 319; and an operation restriction circuit 321 for restricting the operations to be performed on the memory 313. The security circuit 309 functions as a control circuit for the memory 313.

In the present example, it is assumed that the address storage circuit section 316 includes N address storage circuits 1 to N, such that each of the address storage circuits 1 to N stores one address. It is also assumed that the reference address storage circuit section 322 includes M reference address storage circuits 1 to M, such that each of the reference address storage circuits 1 to M stores one reference address. Although the following description is directed to a case where N=M, the present example is not limited thereto.

All of the component elements of the semiconductor device 350 may be provided on one device to realize a security function for the memory 313. However, it is not necessary to provide all of the aforementioned component elements on a single device. For example, the security function may be realized on a number of devices collectively, e.g., by employing a separate security device, which includes the interface circuit 304 and the security circuit 309, to control the memory 313.

The reference address storage circuit section 322 stores predetermined reference addresses (1 to M). The reference address storage circuit section 322 may be arranged so as to be rewritable by providing a dedicated control circuit. Alternatively, any signals which are derivable from fixed circuitry may be employed as reference addresses.

In the present example, the memory 313, the interface circuit 304, the address storage circuit section 316, and the operation restriction circuit 327 may be implemented by using similar means to the memory 13, the interface circuit 4, the address storage circuit section 16 and the operation restriction circuit 20 of the semiconductor device 50 according to Example 1 of the present invention.

An address signal 301, a control signal 302, and a data signal 303 are externally input to the semiconductor device 350 to request overwriting of data stored at a given address of the memory 313. Upon recognizing the request, the interface circuit 304 outputs an internal control signal 306 to the address storage control circuit 314. The address storage control circuit 314 issues an address storage control signal 315 to store the address for which overwrite has been requested in any address storage circuits 1 to N in the address storage circuit section 316 where addresses are not stored yet. In doing so, it is ensured that addresses are sequentially stored in the address storage circuits 1 to N, beginning from the address storing circuit 1. If all of the address storage circuits 1 to N already contain addresses stored therein, the address storage control circuit 314 stores no more addresses in the address storage circuit section 316. As the addresses to be stored, only portions of each address may be stored, rather than all bits of the address, because the order of overwriting is significant, as opposed to the address value itself.

In one embodiment, the security control circuit 319 at least includes a comparison circuit for comparing, in the case where all of the address storage circuits 1 to N contain addresses stored therein, each address (address signal 317) stored in the address storage circuit section 316 against each address (reference address signal 318) stored in the reference address storage circuit section 322. Only if all the addresses match does the security control circuit 319 output a security control signal 320 for deactivating the security function to the operation restriction circuit 321, whereby overwriting operations to the memory 313 will be permitted. If the address signal 317 and the reference address signal 318 do not match, the operation restriction circuit 321 applies restriction on some or all of the operations to be performed on the memory 313.

As a method for restricting some or all of the operations to be performed on the memory 313, any one of the following methods may be employed, without limitation: a method in which the address (as represented by the internal address signal 305) for which an operation is sought is modified so as to be output as an address signal 310 to the memory 313; a method which involves withholding the issuance of a control signal 311 to the memory 313; or a method which involves introducing some modification between the internal data signal 308 and the data signal 312.

Although the above description illustrates a case where the number (N) of address storage circuits in the address storage circuit section 316 and the number (M) of reference address storage circuits in the reference address storage circuit section 322 are equal (N=M), the present invention is not limited to such a structure. In the case where N is not equal to M, the security control circuit 319 may compare any information associated with the address(es) stored in the address storage circuit section 316 against any information associated with the reference addressees) stored in the reference address storage circuit section 322.

In the case where the overwriting of the memory 313 is not restricted in the initial state, any overwriting which is requested in an order not conforming to a predetermined order will result in the restriction of subsequent overwriting, whereby unauthorized overwriting can be prevented. In the case where the overwriting of the memory 313 is restricted in the initial state, the restriction on overwriting is deactivated in response to an overwriting which is requested in an order conforming to the predetermined order, thereby only preventing unauthorized overwriting.

In the present example, for example, a circuit which examines an order in which a number of addresses were accessed may be used as the security control circuit 319, e.g., as described in Japanese Application No. 2000-121844, supra.

In Examples 1 to 4, in the case where non-volatile memory cells are employed as address storage circuits, it is possible to realize an arrangement in which a single instance of requesting overwriting in the wrong order will result in perpetual prohibition of overwriting, whereby enhanced security can be provided.

On the other hand, in the case where volatile memory cells are employed as address storage circuits, even if overwriting is requested in the wrong order, the address storage circuits can always be reset, e.g., by once turning the device OFF and then ON, whereby the history of any overwriting requested in the wrong order can be cleared. As a result, another opportunity for deactivating restriction on overwriting will be given.

Note that the security function according to the present invention can be controlled on the basis of any information associated with the address(es) which is output from the address storage circuit section and/or the data which is output from the data storage circuit section, rather than such addresses and/or data themselves.

A third party who wishes to attempt any unauthorized use of a semiconductor device to which the present invention is applied will have to know the exact principle of unauthorized overwriting prevention according to the present invention as well as any and all previously stored addresses, in order to completely fully overwrite the stored contents. Thus, any unauthorized access by a third party not having such information can be very effectively blocked.

The present invention is generally applicable to any semiconductor device that incorporates a circuit which functions as a memory, as well as commonly-used memory devices. For example, the present invention finds use in processors having internal memories, LCD controllers having internal VRAMs, and the like.

As described above, according to the present invention, a formidable security function for a semiconductor device having rewritable semiconductor memory cells can be provided without requiring any special devices external to the semiconductor device, such that it is difficult for any third party to decipher the method for controlling the security function. Thus, unauthorized access can be very effectively blocked while minimizing the influences on product size and/or cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   a memory having a memory space for recording data, the memory space including addresses;
   at least one first storage section for storing at least a portion of an address at which access to the memory space is requested and/or data which is requested to be written to the memory space; and
   an operation restriction circuit for at least partially restricting operations to be performed on the memory such that operations to be performed on the memory are respectively restricted unless the restrictions on said operations are released,
      wherein the operation restriction circuit controls restriction on the operations to be performed on the memory based on at least a portion of the data and/or the address stored in the at least one first storage section.

2. A semiconductor device according to claim 1, wherein the access is a write operation.

3. A semiconductor device according to claim 1, wherein the at least one first storage section comprises a plurality of storage subsections.

4. A semiconductor device according to claim 1, wherein, if at least one of the at least one first storage section does not contain the address or data stored therein, the operation restriction circuit maintains restriction on the operations to be performed on the memory.

5. A semiconductor device according to claim 1, wherein:
   the at least one first storage section includes an address storage section for storing the address, and a data storage section for storing the data;
   the semiconductor device includes a comparison circuit for performing a comparison of data in the memory space as designated by the address stored in the address storage section against the data stored in the data storage section; and
   the operation restriction circuit maintains restriction on the operations to be performed on the memory if a result of the comparison by the comparison circuit does not match.

6. A semiconductor device according to claim 1, further comprising:
   a second storage section for storing a reference address; and
   a comparison circuit for performing a comparison of the address stored in the first storage section against the reference address stored in the second storage section, wherein the operation restriction circuit deactivates restriction on the operations to be performed on the memory if a result of the comparison by the comparison circuit matches.

7. A semiconductor device according to claim 1, wherein:

the memory includes a storage unit for containing data which is to be concurrently rewritten; and the first storage section is included in the storage unit.

8. A control device for controlling a memory having a memory space for recording data, the memory space including addresses, the control device comprising:

at least one first storage section for storing at least a portion of an address at which access to the memory space is requested and/or data which is requested to be written to the memory space; and an operation restriction circuit for at least partially restricting operations to be performed on the memory such that operations to be performed on the memory are respectively restricted unless the restrictions are released, wherein the operation restriction circuit controls restriction on the operations to be performed on the memory based on at least a portion of the data and/or the address stored in the at least one first storage section.

9. A control device according to claim 8, wherein the access is a write operation.

10. A control device according to claim 8, wherein the at least one first storage section comprises a plurality of storage subsections.

11. A control device according to claim 8, wherein, if at least one of the at least one first storage section does not contain the address or data stored therein, the operation restriction circuit maintains restriction on the operations to be performed on the memory.

12. A control device according to claim 8, wherein:

the at least one first storage section includes an address storage section for storing the address, and a data storage section for storing the data;

the semiconductor device includes a comparison circuit for performing a comparison of data in the memory space as designated by the address stored in the address storage section against the data stored in the data storage section; and the operation restriction circuit maintains restriction on the operations to be performed on the memory if a result of the comparison by the comparison circuit does not match.

13. A control device according to claim 8, further comprising:

a second storage section for storing a reference address; and a comparison circuit for performing a comparison of the address stored in the first storage section against the reference address stored in the second storage section, wherein the operation restriction circuit deactivates restriction on the operations to be performed on the memory if a result of the comparison by the comparison circuit matches.

14. A control device according to claim 8, wherein:

the memory includes a storage unit for containing data which is to be concurrently rewritten; and the first storage section is included in the storage unit.

15. A semiconductor device comprising:

a memory having a memory space for recording data, the memory space including addresses;

at least one first storage section for storing at least a portion of an address at which access to the memory space is requested and/or data which is requested to be written to the memory space;and an operation restriction circuit for at least partially restricting operations to be performed on the memory, wherein, when an operation to be performed on the memory is restricted, data corresponding to the operation is not written to or output from the device.

16. A control device for controlling a memory having a memory space for recording data, the memory space including addresses, the control device comprising:

at least one first storage section for storing at least a portion of an address at which access to the memory space is requested and/or data which is requested to be written to the memory space; and an operation restriction circuit for at least partially restricting operations to be performed on the memory, wherein, when an operation to be performed on the memory is restricted, data corresponding to the operation is not written to or output from the device.

* * * * *